(12) United States Patent
Kim et al.

(10) Patent No.: US 11,694,728 B2
(45) Date of Patent: Jul. 4, 2023

(54) STORAGE DEVICE AND OPERATING METHOD THEREOF

(71) Applicant: SK hynix Inc., Gyeonggi-do (KR)

(72) Inventors: Jeong Hyun Kim, Gyeonggi-do (KR); Jin Soo Kim, Gyeonggi-do (KR); Min Su Son, Gyeonggi-do (KR); Na Young Lee, Gyeonggi-do (KR); Chui Woo Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 161 days.

(21) Appl. No.: 17/235,327

(22) Filed: Apr. 20, 2021

(65) Prior Publication Data

US 2022/0122641 A1     Apr. 21, 2022

(30) Foreign Application Priority Data

Oct. 16, 2020 (KR) .................. 10-2020-0134660

(51) Int. Cl.
*G11C 5/14* (2006.01)
*G06F 11/30* (2006.01)

(52) U.S. Cl.
CPC ............ *G11C 5/14* (2013.01); *G06F 11/3037* (2013.01); *G06F 11/3058* (2013.01)

(58) Field of Classification Search
CPC ........... G11C 5/14; G11C 7/1063; G11C 7/04; G11C 8/08; G11C 7/12; G11C 16/06; G06F 11/3037; G06F 11/3058; G06F 3/0659
See application file for complete search history.

(56) References Cited

U.S. PATENT DOCUMENTS

| | | | |
|---|---|---|---|
| 2014/0016421 A1* | 1/2014 | Kim | ................. G11C 11/40618 365/222 |
| 2020/0034068 A1* | 1/2020 | Masubuchi | ........... G06F 3/0604 |
| 2020/0286547 A1* | 9/2020 | Maruyama | ............... G11C 7/04 |

FOREIGN PATENT DOCUMENTS

KR       10-2044610       11/2019

* cited by examiner

*Primary Examiner* — Ajay Ojha
(74) *Attorney, Agent, or Firm* — IP & T Group LLP

(57) ABSTRACT

A storage device may include: a memory device including a temperature sensor; and a memory controller for acquiring, from the memory device, temperature information sensed by the temperature sensor for a temperature management period, performing a performance limiting operation of limiting the performance of the memory device according to the temperature information, calculating the temperature management period by using the temperature information, and updating the temperature management period by using history information on a performance history of the performance limiting operation.

18 Claims, 12 Drawing Sheets

STORAGE DEVICE AND OPERATING METHOD THEREOF

CROSS-REFERENCE TO RELATED APPLICATION

The present application claims priority under 35 U.S.C. § 119(a) to Korean patent application number 10-2020-0134660 filed on Oct. 16, 2020, which is incorporated herein by reference in its entirety.

BACKGROUND

Field of Invention

The present disclosure generally relates to an electronic device, and more particularly, to a storage device and an operating method thereof.

Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Various embodiments of the present disclosure provide a storage device for performing an improved temperature management operation and an operating method of the storage device.

In accordance with an aspect of the present disclosure, there is provided a storage device including: a memory device including a temperature sensor; and a memory controller configured to acquire, from the memory device, temperature information sensed by the temperature sensor for each temperature management period, perform a performance limiting operation of limiting the performance of the memory device according to the temperature information, calculate the temperature management period by using the temperature information, and update the temperature management period by using history information on a performance history of the performance limiting operation.

In accordance with another aspect of the present disclosure, there is provided a method for operating a storage device including a temperature sensor, the method including: acquiring temperature information sensed by the temperature sensor for each temperature management period; performing a performance limiting operation of limiting the performance of the storage device according to the temperature information; calculating a minimum period and a maximum period of the temperature management period by using the temperature information; and updating the temperature management period by using history information on a performance history of the performance limiting operation, the minimum period, and the maximum period.

In accordance with still another aspect of the present disclosure, there is provided a storage device including: a memory device including a temperature sensor; and a memory controller configured to perform a temperature management operation including a temperature acquisition operation of acquiring temperature information sensed by the temperature sensor from the memory device and a performance limiting operation of limiting the performance of the memory device according to the temperature information, wherein the memory controller: calculates a temperature variation per unit time based on previous temperature information on a first temperature management operation performed before the temperature management operation and time information on the first temperature management operation; calculates a first performance time and a second performance time of a second temperature management operation to be performed after the temperature management operation, based on the temperature variation per unit time; and determines a final performance time of the second temperature management operation by using the temperature information, an accumulated number of times the performance limiting operation is performed, the first performance time, and the second performance time.

BRIEF DESCRIPTION OF THE DRAWINGS

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the present disclosure. The embodiments according to the present disclosure can be implemented in various forms, and cannot be construed as limited to the embodiments set forth herein.

Figure 1:
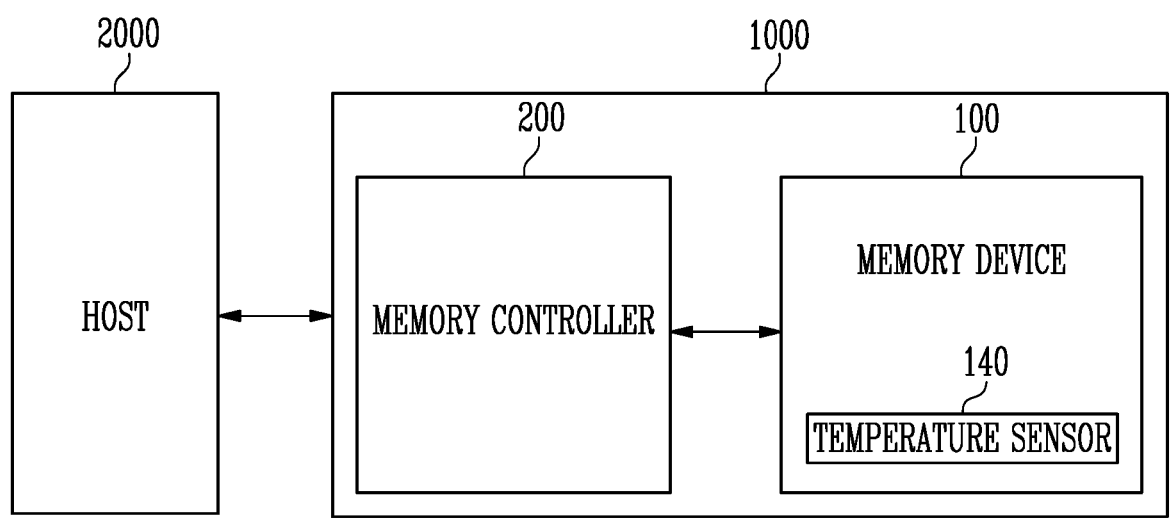
FIG. 1 is a block diagram illustrating a storage device in accordance with an embodiment of the present disclosure.

FIG. 1 is a block diagram illustrating a storage device in accordance with an embodiment of the present disclosure.

Referring to FIG. 1, the storage device 1000 may include a memory device 100 and a memory controller 200.

The storage device 1000 may be a device for storing data under the control of a host 2000, such as a mobile phone, a smart phone, an MP3 player, a laptop computer, a desktop computer, a game console, a display device, a tablet PC or an in-vehicle infotainment.

The storage device 1000 may be manufactured as any of various types of storage devices according to a host interface that is a communication scheme with the host 2000. For example, the storage device 1000 may be implemented with any of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 1000 may be implemented as any of various types of package types. For example, the storage device 1000 may be implemented as any of various types of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data or use stored data. The memory device 100 operates under the control of the memory controller 200. Also, the memory device 100 may include a plurality of memory dies, and each of the plurality of memory dies may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells, and one memory block may include a plurality of pages. The page may be a unit for storing data in the memory device 100 or reading data stored in the memory device 100.

The memory device 100 may be implemented as a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is described.

The memory device 100 may receive a command and an address from the memory controller 200. The memory device 100 may access an area selected by the received address in the memory cell array. When the memory device 100 accesses the selected area, it may mean that the memory device 100 performs an operation corresponding to the received command on the selected area. For example, the memory device 100 may perform a write operation (program operation), a read operation, and an erase operation. The program operation may be an operation in which the memory device 100 records data in the area selected by the address. The read operation may mean an operation in which the memory device 100 reads data from the area selected by the address. The erase operation may mean an operation in which the memory device 100 erases data stored in the area selected by the address.

In accordance with an embodiment of the present disclosure, the memory device 100 may include a temperature sensor 140. Also, the memory device 100 may transmit temperature information sensed by the temperature sensor 140 to the memory controller 200 in response to a temperature information request received from the memory controller 200 for each temperature management period. The temperature information may be a code CODE corresponding to a temperature sensed by the temperature sensor 140. Specifically, the temperature sensor 140 may be implemented as a digital temperature sensing circuit to convert the sensed temperature into the code CODE as a digital signal and then output the code CODE. That is, the temperature sensor 140 may output a code corresponding to a temperature, and transmit the output code to the memory device 100 or the memory controller 200.

Also, the temperature sensor 140 may sense a temperature of the memory device 100 or the storage device 1000 in response to a command (e.g., the temperature information request) transmitted from the memory device 100 or the memory controller 200, and output temperature information corresponding to the sensed temperature. Alternatively, the temperature sensor 140 may perform an operation of sensing a temperature of the memory device 100 or the storage device 1000 and outputting temperature information according to a constant time regardless of the command transmitted from the memory device 100 or the memory controller 200. Specifically, the temperature sensor 140 may perform an operation of sensing a temperature and outputting temperature information according to a constant period, and the memory device 100 may store the temperature information output from the temperature sensor 140. When the memory device 100 receives the temperature information request from the memory controller 200, the memory device 100 may transmit the stored temperature information to the memory controller 200.

The memory controller 200 may control overall operations of the storage device 1000. When power is applied to the storage device 1000, the memory controller 200 may execute firmware (FW). The FW may include a Host Interface Layer (HIL) which receives a request input from the host 2000 or outputs a response to the host 2000, a Flash Translation Layer (FTL) which manages an operation between an interface of the host 2000 and an interface of the memory device 100, and a Flash Interface Layer (FIL) which provides a command to the memory device 100 or receives a response from the memory device 100.

The memory controller 200 may receive data and a Logical Address (LA) from the host 2000, and translate the LA into a Physical Address (PA) representing an address of memory cells included in the memory device 100 in which data is to be stored. The LA may be a Logical Block Address (LBA), and the PA may be a Physical Block Address (PBA).

The memory controller 200 may control the memory device 100 to perform a program operation, a read operation, an erase operation, or the like in response to a request from the host 2000. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

The memory controller 200 may control the memory device 100 to autonomously perform a program operation, a read operation, or an erase operation regardless of any request from the host 2000. For example, the memory controller 200 may control the memory device 100 to perform a program operation, a read operation, or an erase operation, which is used to perform a background operation such as wear leveling, garbage collection, or read reclaim.

The host 2000 may communicate with the storage device 1000, using at least one of various communication interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Moreover, although a case where the temperature sensor 140 is included in the memory device 100 is illustrated in FIG. 1, this is merely an embodiment of the present disclosure, and the temperature sensor 140 may be implemented in a form in which the temperature sensor 140 is attached to the outside of the memory device or be implemented as a separate electronic device.

Figure 2:
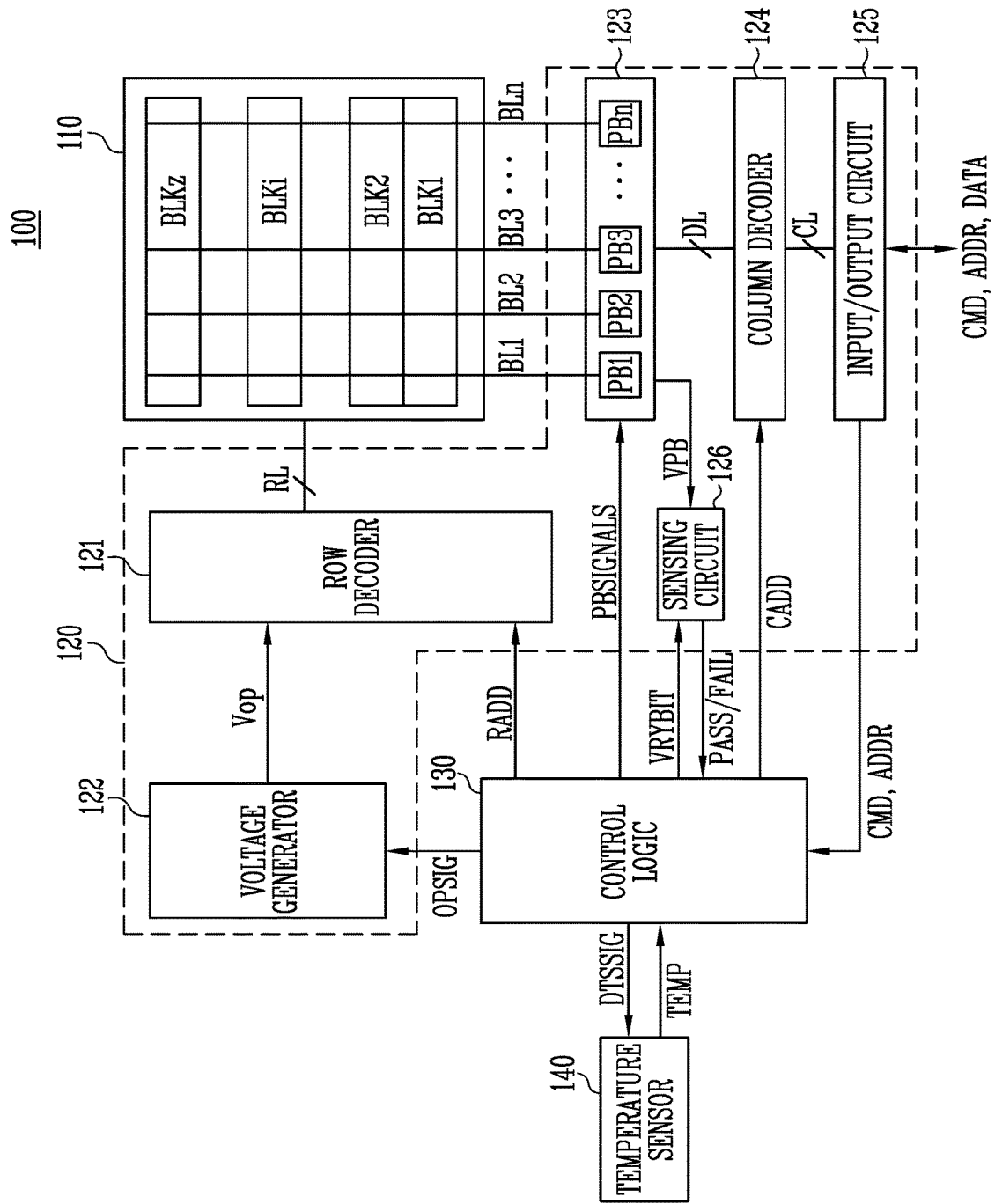
FIG. 2 is a block diagram illustrating a memory device in accordance with an embodiment of the present disclosure.

FIG. 2 is a block diagram illustrating a memory device in accordance with an embodiment of the present disclosure.

Referring to FIG. 2, the memory device 100 may include a memory cell array 110, a peripheral circuit 120, a control logic 130, and a temperature sensor 140.

The memory cell array 110 includes a plurality of memory blocks BLK1 to BLKz. The plurality of memory blocks BLK1 to BLKz are connected to a row decoder 121 through row lines RL. The row lines RL may include at least one source select line, a plurality of word lines, and at least one drain select line. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may be configured to perform a program operation, a read operation or an erase operation on a selected area of the memory cell array 110 under the control of the control logic 130. That is, the peripheral circuit 120 may drive the memory cell array 110 under the control of the control logic 130. For example, the peripheral circuit 120 may apply various operating voltages to the row lines RL and the bit lines BL1 to BLn or discharge the applied voltages under the control of the control logic 130.

Specifically, the peripheral circuit 120 may include the row decoder 121, a voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of the control logic 130. The row decoder 121 may receive a row address RADD from the control logic 130. Specifically, the row decoder 121 may decode the row address RADD. The row decoder 121 may select at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage higher than the verify voltage to the unselected word lines. In a read operation, the row decoder 121 may apply a read voltage to the selected word line, and apply a read pass voltage higher than the read voltage to the unselected word lines.

In an embodiment, an erase operation of the memory device 100 may be performed in a memory block unit. In the erase operation, the row decoder 121 may select one memory block according to the decoded address. In the erase operation, the row decoder 121 may apply a ground voltage to word lines connected to the selected memory block.

The voltage generator 122 may operate under the control of the control logic 130. Specifically, the voltage generator 122 may generate a plurality of voltages by using an external power voltage supplied to the memory device 100 under the control of the control logic 130. For example, the voltage generator 122 may generate a program voltage, a verify voltage, a pass voltage, a read voltage, an erase voltage, and the like under the control of the control logic 130. That is, the voltage generator 122 may generate various operating voltages Vop used in program, read, and erase operations in response to an operation signal OPSIG.

In an embodiment, the voltage generator 122 may generate an internal power voltage by regulating the external power voltage. The internal power voltage generated by the voltage generator 122 may be used as an operation voltage of the memory cell array 110.

In an embodiment, the voltage generator 122 may generate a plurality of voltages by using the external power voltage or the internal power voltage. For example, the voltage generator 122 may include a plurality of pumping capacitors for receiving the internal power voltage, and generate the plurality of voltages by selectively activating the plurality of pumping capacitors under the control of the control logic 130. In addition, the plurality of generated voltages may be supplied to the memory cell array 110 by the row decoder 121.

The page buffer group 123 may include first to nth page buffers PB1 to PBn. The first to nth page buffers PB1 to PBn may be connected to the memory cell array 110 respectively through first to nth bit lines BL1 to BLn. Also, the first to nth bit lines BL1 to BLn may operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense a voltage or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page may be programmed according to the transferred data DATA. A memory cell connected to a bit line to which a program allow voltage (e.g., a ground voltage) is applied may have an increased threshold voltage. A threshold voltage of a memory cell connected to a bit line to which a program inhibit voltage (e.g., a power voltage) is applied may be maintained.

In a program verify operation, the first to nth page buffers PB1 to PBn may read page data from the selected memory cells through the first to nth bit lines BL1 to BLn.

In a read operation, the first to nth page buffers PB1 to PBn may read data DATA from the memory cells of the selected page through the first to nth bit lines BL1 to BLn, and outputs the read data DATA to the input/output circuit 125 under the control of the column decoder 124.

In an erase operation, the first to nth page buffers PB1 to PBn may float the first to nth bit lines BL1 to BLn.

The column decoder 124 may communicate data between the input/output circuit 125 and the page buffer group 123 in response to a column address CADD. For example, the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller 200, to the control logic 130, or exchange data DATA with the column decoder 124.

In a read operation or verify operation, the sensing circuit 126 may generate a reference current in response to an allow bit VRYBIT signal, and output a pass or a fail signal PASS or FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass or fail signal PASS or FAIL. Also, the control logic 130 may control the page buffer group 123 to temporarily store verify information including the pass or fail signal PASS or FAIL in the page buffer group 123. Specifically, the control logic 130 may determine a program state of a memory cell in response to the pass or fail signal PASS or FAIL. For example, when the memory cell operates as a Triple Level Cell (TLC), the control logic 130 may determine whether the program state of the memory cell is one of an erase state E or first to seventh program states P1 to P7.

In accordance with an embodiment of the present disclosure, the control logic 130 may control an operation of the temperature sensor 140 in response to a temperature information request received from the memory controller 200. The temperature sensor 140 may output temperature information TEMP corresponding to a sensed temperature in response to a temperature sensor control signal DTSSIG provided from the control logic 130. The temperature sensor control signal DTSSIG may be transmitted to the temperature sensor 140 for each predetermined period. For example, the temperature sensor control signal DTSSIG may be generated for each temperature management period of the memory controller 200 to be transmitted to the temperature sensor 140.

Moreover, although a case where the temperature sensor 140 is located at the inside of the memory device 100 is illustrated in FIG. 2, the temperature sensor 140 may be implemented in a form in which the temperature sensor 140 is located at the outside of the memory device 100. A configuration and an operation of the temperature sensor 140 will be described in detail with reference to FIG. 3.

Figure 3:
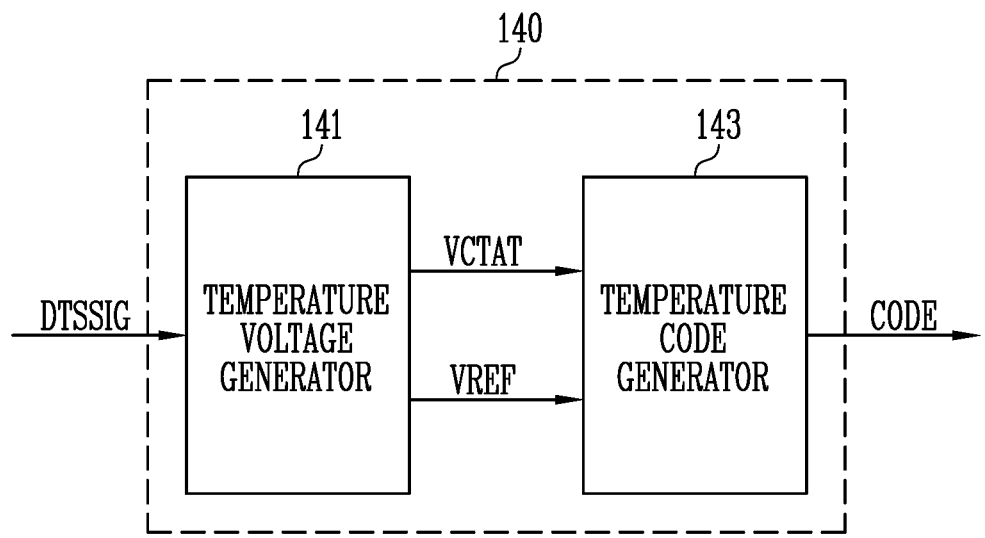
FIG. 3 is a block diagram illustrating a temperature sensor in accordance with an embodiment of the present disclosure.

FIG. 3 is a block diagram illustrating a temperature sensor in accordance with an embodiment of the present disclosure.

Referring to FIG. 3, the temperature sensor 140 may include a temperature voltage generator 141 and a temperature code generator 143. The temperature sensor 140 may output temperature information TEMP corresponding to a sensed temperature in response to a temperature sensor control signal DTSSIG. The temperature sensor control signal DTSSIG may be generated for each predetermined period.

The temperature voltage generator 141 may generate a temperature voltage and a reference voltage in response to the received temperature sensor control signal DTSSIG. Specifically, the temperature voltage generator 141 may generate a temperature voltage VCTAT having a voltage level determined according to a temperature and a reference voltage VREF having a constant level in spite of a temperature change by using a voltage received from the voltage generator 122 shown in FIG. 2.

Specifically, the temperature voltage VCTAT generated by the temperature voltage generator 141 is a voltage corresponding to a temperature, and may be a voltage having a voltage level increased or decreased according to a temperature change. The temperature voltage generator 141 may include a transistor having a threshold voltage changed according to a temperature change or a resistor having a resistance value changed according to a temperature change. Also, the temperature voltage generator 141 may generate the temperature voltage VCTAT by using the transistor having the threshold voltage changed according to the temperature change or the resistor having the resistance value changed according to the temperature change.

The reference voltage VREF generated by the temperature voltage generator 141 may be a voltage having a constant voltage level regardless of the temperature change. Specifically, the reference voltage VREF may include VREF+ as a relatively high voltage and VREF− as a relatively low voltage. In addition, the temperature voltage generator 141 may be implemented in a form including a band gap voltage generation circuit or a Widlar voltage generation circuit, which allows a voltage to have a constant potential regardless of the temperature change.

The temperature code generator 143 may generate a code CODE, based on the temperature voltage VCTAT and the reference voltage VREF, which are received from the temperature voltage generator 141. The temperature voltage VCTAT and the reference voltage VREF may have an analog value corresponding to the temperature of the memory device 100, and the code CODE may have a digital value corresponding to the temperature information. That is, the temperature code generator 143 may be implemented as an Analog-to-Digital Converter (ADC) which converts the temperature voltage VCTAT and the reference voltage VREF as analog signals into a code CODE as a digital signal.

The code CODE may be implemented with a higher resolution as the number of bits becomes larger. The resolution may mean a difference between an actual internal temperature and a temperature represented by the generated code. For example, when the resolution is low, the code may be expressed as 0 when the actual internal temperature is 5° C., and the code may be expressed as 1 when the actual internal temperature is 10° C. On the other hand, when the resolution is high, the code may be expressed as 0 when the actual internal temperature is 5° C., and the code may be expressed as 5 when the actual internal temperature is 10° C. That is, since a difference between codes output at the same temperature difference becomes larger as the resolution becomes higher, the difference between the actual internal temperature and the temperature represented by the generated code becomes small, and the actual internal temperature corresponding to the code can be accurately expressed.

Figure 4:
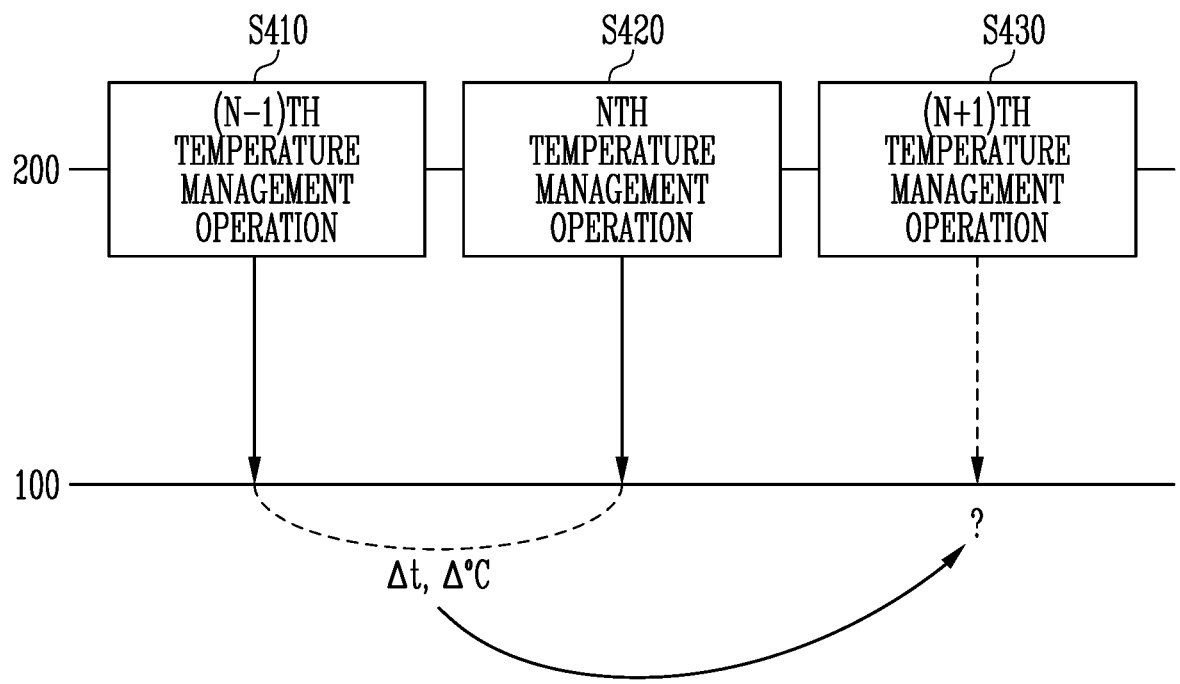
FIG. 4 is a diagram illustrating a plurality of temperature management operations in accordance with an embodiment of the present disclosure.

FIG. 4 is a diagram illustrating a plurality of temperature management operations in accordance with an embodiment of the present disclosure.

Referring to FIG. 4, an (n−1)th temperature management operation S410, an nth temperature management operation S420, and an (n+1)th temperature management operation S430 are illustrated. The temperature management operation may be an operation of managing an internal temperature of the storage device 1000. Specifically, the internal operation of the storage device 1000 may increase when the storage device 1000 performs an internal operation. Also, when the internal operation of the storage device 1000 becomes excessively high, a component of the storage device 1000 may be damaged, and it may be highly likely that an operation of the storage device 1000 will be degraded. Therefore, the temperature management operation may be an operation of managing the internal temperature of the storage device 1000 to prevent damage and degradation, which occur when the internal temperature of the storage device 1000 becomes high.

The storage device 1000 may perform a temperature management operation including a temperature acquisition operation of acquiring temperature information sensed by the temperature sensor 140 and a performance limiting operation of limiting the performance of the storage device 1000 according to the acquired temperature information. That is, the performance limiting operation may be an operation of limiting an internal operation of the storage device 1000 such that the internal temperature of the storage device 1000 is decreased when the internal temperature of the storage device 1000 becomes excessively high. For example, the storage device 1000 may control a total current amount flowing into the storage device 1000 by suspending the whole or a portion of an operation performed in the storage device 1000. The storage device 1000 controls the total current amount, to prevent a case where the internal temperature of the storage device 1000 is excessively overheated. Alternatively, the storage device 1000 may decrease a processing speed (e.g., a clock number per a unit of time) of the internal operation, to prevent a case where the internal temperature of the storage device 1000 is excessively overheated.

However, frequent performance of the temperature management operation may cause unnecessary power waste, and decrease performance overhead of the storage device 1000 due to the performance of the temperature management operation. In accordance with the embodiment of the present disclosure, the storage device 1000 can perform an efficient temperature management operation according to an improved temperature management operation.

In this specification, for convenience of description, the temperature management operation is made by the memory controller 200 performing the temperature management operation on the memory device 100. However, the temperature management operation may be equally applied to a case where the temperature of the memory controller 200 or the storage device 1000 is overheated to a predetermined throttling temperature or higher.

Referring to FIG. 4, the storage device 1000 may perform a temperature management operation according to the temperature management period. For example, the storage device 1000 may perform the (n−1)th temperature management operation S410, and perform the nth temperature management operation S420 after a time amount Δt corresponding to the temperature management period. Also, the storage device 1000 may update the temperature management period by using the time amount Δt and temperature information Δ° C. representing variance in the temperature sensed by the temperature sensor 140 of the memory device during the time amount. That is, in accordance with an embodiment of the present disclosure, the storage device 1000 may determine a point in time to start the (n+1)th temperature management operation S430, based on a result obtained by performing the nth temperature management operation S420. For example, the storage device 1000 may determine the point in time to start the (n+1)th temperature management operation S430 by using the time amount Δt and the temperature information Δ° C. acquired from the temperature sensor 140 in the nth temperature management operation S420.

In accordance with another embodiment of the present disclosure, the temperature management operation may include a temperature acquisition operation of acquiring temperature information sensed by the temperature sensor 140 from the memory device 100 and a performance limiting operation of limiting the performance of the memory device 100 according to the acquired temperature information and the time amount Δt. The memory controller 200 may calculate a temperature variation per a unit of time, based on the temperature information measured in the (n−1)th temperature management operation performed before the nth temperature management operation. Specifically, the memory controller 200 may calculate a temperature variation (e.g., the temperature information Δ° C.) by comparing temperature information sensed in the (n−1)th temperature management operation with temperature information sensed in the nth temperature management operation. Also, the memory controller 200 may calculate a time variation (e.g., the time amount Δt corresponding to the temperature management period) by comparing a time point of starting the (n−1)th temperature management operation with a time point of starting the nth temperature management operation. The memory controller 200 may calculate a temperature variation Δ° C. and a time variation Δt by comparing the (n−1)th temperature management operation with the nth temperature management operation, and calculate a temperature variation per a unit of time, based on the temperature variation Δ° C. and the time variation Δt. Also, the memory device 200 may calculate a first point in time and a second point in time to start the (n+1)th temperature management operation to be performed after the nth temperature management operation, based on the temperature variation per a unit of time. The memory controller 200 may determine a final point in time to start the (n+1)th temperature management operation by using the temperature information sensed in the nth temperature management operation, an accumulated number of times that the performance limiting operation is performed up to the (n−1)th temperature management operation after power is applied to the storage device 1000, and the first and second points in time.

In various embodiments, the memory controller 200 may generate corrected temperature information by using temperature information, and perform the above-described operations by using the corrected temperature information. The corrected temperature information may be temperature information obtained by processing the temperature information according to various methods. Alternatively, the memory controller 200 may further include another temperature sensor separate from the temperature sensor 140 included in the memory device 100. The memory controller 200 may calculate the corrected temperature information by using the another temperature sensor separately from the temperature sensor 140 included in the memory device 100. For example, the memory controller 200 may calculate the corrected temperature information by calculating an arithmetic mean value of temperature information received from the temperature sensor 140 included in the memory device 100 and temperature information of the another temperature sensor included separately from the temperature sensor 140.

Figure 5:
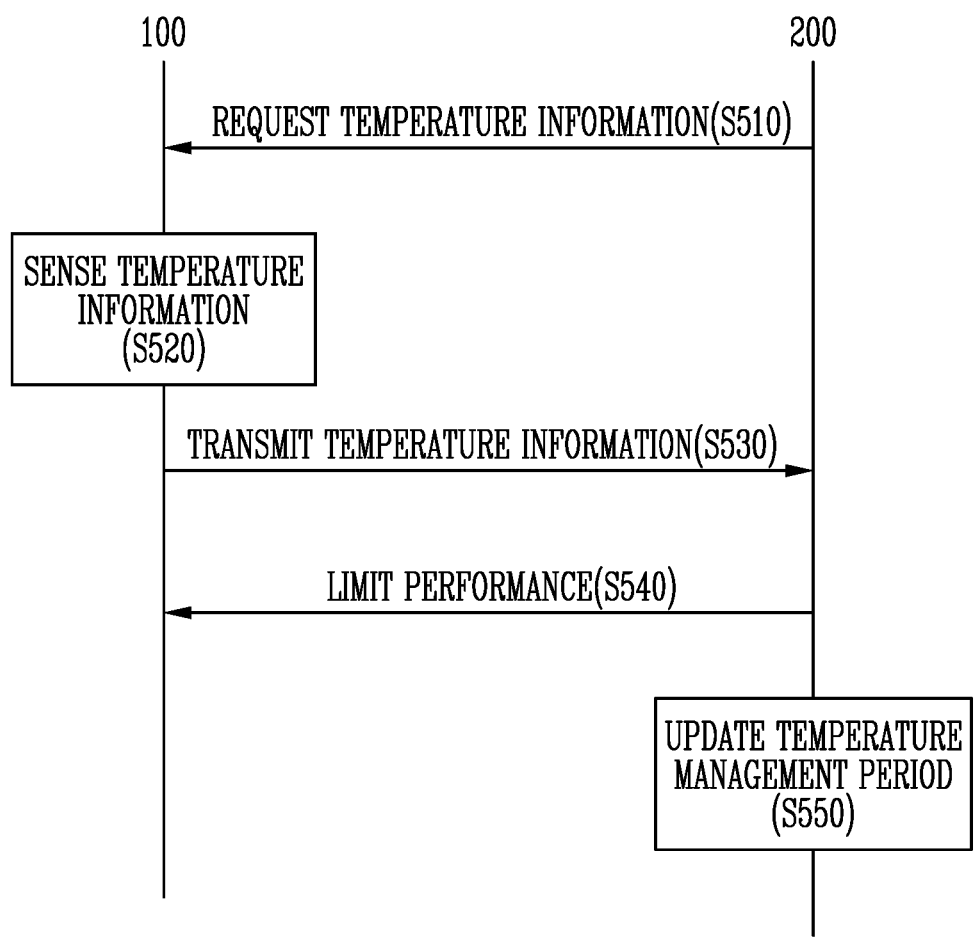
FIG. 5 is a diagram illustrating a temperature management operation in accordance with an embodiment of the present disclosure.

FIG. 5 is a diagram illustrating a temperature management operation in accordance with an embodiment of the present disclosure.

Referring to FIG. 5, a diagram is illustrated, in which the memory device 100 and the memory controller 200 perform the nth temperature management operation S420. The nth temperature management operation S420 may include an operation in which the memory controller 200 requests temperature information of the memory device 100 (S510). Specifically, the memory controller 200 may request temperature information from the memory device 100 including the temperature sensor 140 for each temperature management period.

In addition, the memory device 100 may perform an operation of sensing temperature information in response to a temperature information request received from the memory controller 200 (S520). Specifically, the memory device 100 may control the temperature sensor 140 included in the memory device 100, and perform the operation of sensing the temperature information by using the temperature sensor 140.

Also, the memory device 100 may transmit temperature information acquired from the temperature sensor 140 (S530), and the memory controller 200 may perform a performance limiting operation of limiting the performance of the memory device 100 according to the temperature information (S540). The performance limiting operation may be an operation of limiting an internal operation of the storage device 1000 such that an internal temperature of the storage device 1000 is decreased when the internal temperature of the storage device 1000 becomes excessively high.

In addition, the memory controller 200 may update the temperature management period by using the temperature information (S550). Specifically, the memory controller 200 may calculate a minimum period and a maximum period of the temperature management period by using the temperature information and a reference temperature management period and update the temperature management period by using history information on the performance limiting operation being performed after power is applied to the storage device 1000, the minimum period, and the maximum period. The update of the temperature management period will be described in detail with reference to FIGS. 6 and 7.

Figure 6:
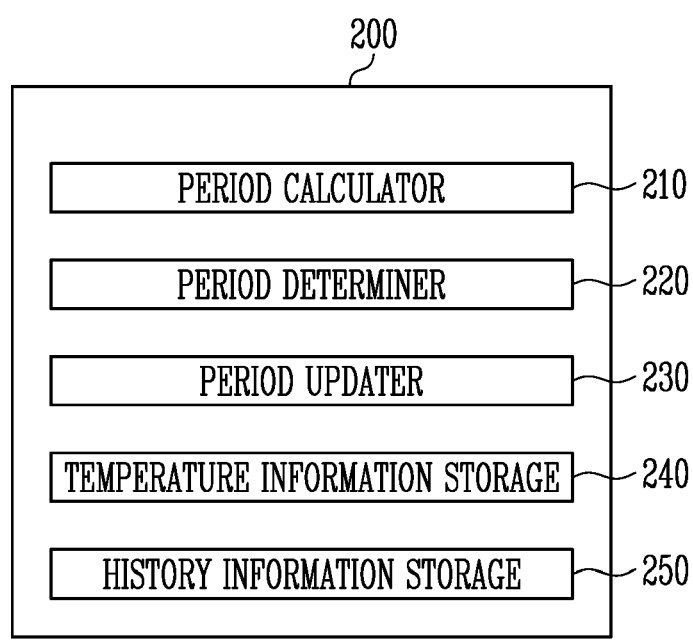
FIG. 6 is a block diagram illustrating a memory controller in accordance with an embodiment of the present disclosure.
Figure 7:
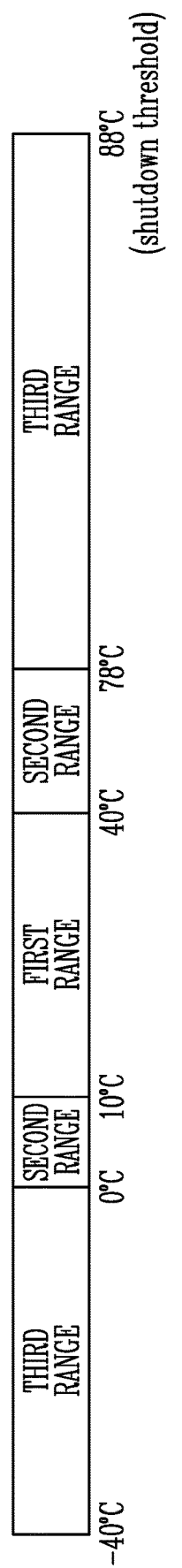
FIG. 7 is a diagram illustrating a plurality of temperature ranges in accordance with an embodiment of the present disclosure.

FIG. 6 is a block diagram illustrating a memory controller in accordance with an embodiment of the present disclosure. FIG. 7 is a diagram illustrating a plurality of temperature ranges in accordance with an embodiment of the present disclosure.

Referring to FIG. 6, the memory controller 200 may include a period calculator 210, a period determiner 220, a period updater 230, a temperature information storage 240, and history information storage 250.

The period calculator 210 may be a component for calculating the minimum period and the maximum period of a temperature management period. Specifically, the period calculator 210 may calculate the temperature variation per a unit of time by using the temperature information and the reference temperature management period, and calculate the minimum period and the maximum period by using the temperature variation per a unit of time and an initial temperature management period or a predetermined temperature management period. The initial temperature management period may be a reference temperature management period. Also, the period calculator 210 may calculate the minimum period and the maximum period according to the following Equation 1.

$$\text{MIN\_SEC} = X*(T*(1+DT))$$

$$\text{MAX\_SEC} = Y*(T*(1+DT)) \hspace{2cm} \text{Equation 1}$$

T may be the reference temperature management period, DT may be a temperature variation per a unit of time within each temperature management period, MIN_SEC may be a minimum period, MAX_SEC may be a maximum period, X may be an arbitrary constant, and Y may be an arbitrary constant greater than X. A unit of T may have [s], a unit of DT may have [° C./s], a unit of each of MIN_SEC and MAX_SEC may have [s], and a unit of each of X and Y may have [° C./s].

The period calculator 210 may increase the minimum period and the maximum period when the temperature variation per a unit of time increases, and decrease the minimum period and the maximum period when the temperature variation per a unit of time decreases.

The period determiner 220 may be a component for determining the current temperature reflected period and the history reflected period. The current temperature reflected period may be a period determined based on temperature information received from the temperature sensor 140. That is, the current temperature reflected period may be a period obtained by reflecting a current temperature state of the memory device 100.

The period determiner 220 may determine, as the current temperature reflected period, any of the minimum period, the maximum period, and an arithmetic mean value of the minimum period and the maximum period according to the temperature information. Specifically, the period determiner 220 may determine the current temperature reflected period according to whether the temperature of the memory device 100 corresponding to the temperature information belongs to one of a plurality of temperature ranges.

Referring to FIG. 7, the plurality of temperature ranges are illustrated. A first range may be a temperature range higher than a first temperature (e.g., 10° C.) and lower than and equal to a second temperature (e.g., 40° C.). A second range may be one or more of a temperature range higher than 0° C. and lower than or equal to the first temperature (e.g., 10° C.) and a temperature range higher than the second temperature (e.g., 40° C.), and lower than or equal to a third temperature (e.g., 78° C.). A third range may be one or more of a temperature range lower than or equal to 0° C. and a temperature range higher than the third temperature (e.g., 78° C.).

When the temperature of the memory device 100 corresponding to the temperature information belongs to the first range, the period determiner 220 may determine the maximum period as the current temperature reflected period. When the temperature of the memory device 100 corresponding to the temperature information belongs to the second range, the period determiner 220 may determine the arithmetic mean value of the minimum period and the maximum period as the current temperature reflected period. When the temperature of the memory device 100 corresponding to the temperature information belongs to the third range, the period determiner 220 may determine the minimum period as the current temperature reflected period.

The period determiner 220 may determine the history reflected period according to a number of times the performance limiting operation is performed from after the power is applied to the storage device 1000. When the temperature of the memory device 100 corresponding to the temperature information belongs to the third range shown in FIG. 7, the memory controller 200 may perform a performance limiting operation of limiting the performance of the memory device 100. For example, when the temperature of the memory device 100 corresponding to the temperature information is a temperature higher than the third temperature, the memory controller 200 may perform the performance limiting operation. Also, the memory controller 200 may store, in the history information storage 250, the number of times the performance limiting operation is performed from after the power is applied to the storage device 1000.

The period determiner 220 may determine the history reflected period according to the following Table 1.

TABLE 1

| <Accumulated number of times performance limiting operation is performed> | <History reflected period> |
| --- | --- |
| First range (0 to 30 times) | Maximum period |
| Second range (31 times to 100 times) | Arithmetic mean of maximum period and minimum period |
| Third range (exceeding 100 times) | Minimum period |

When the accumulated number of times belongs to the first range, the period determiner 220 may determine the maximum period as the history reflected period. When the accumulated number of times belongs to the second range, the period determiner 220 may determine the arithmetic mean value of the minimum period and the maximum period as the history reflected period. When the accumulated number of times belongs to the third range, the period determiner 220 may determine the minimum period as the history reflected period. The period updater 230 may be a component for updating the temperature management period by using the current temperature reflected period and the history reflected period. Specifically, the period updater 230 may update the temperature management period by using an arithmetic mean value of the current temperature reflected period and the history reflected period, which are determined by the period determiner 220. For example, when the current temperature reflected period is the minimum period and the history reflected period is the maximum period, the period updater 230 may update the temperature management period to a value of (minimum period+maximum period)/2.

Furthermore, the memory controller 200 in accordance with the embodiment of the present disclosure may include the temperature information storage 240 and the history information storage 250. The temperature information storage 240 may be a component for receiving temperature information sensed by the temperature sensor 140 from the memory device 100 and storing the received temperature information, and the history information storage 250 may be a component for storing an accumulated number of times the performance limiting operation is performed from after the power is applied to the storage device 1000.

Figure 8:
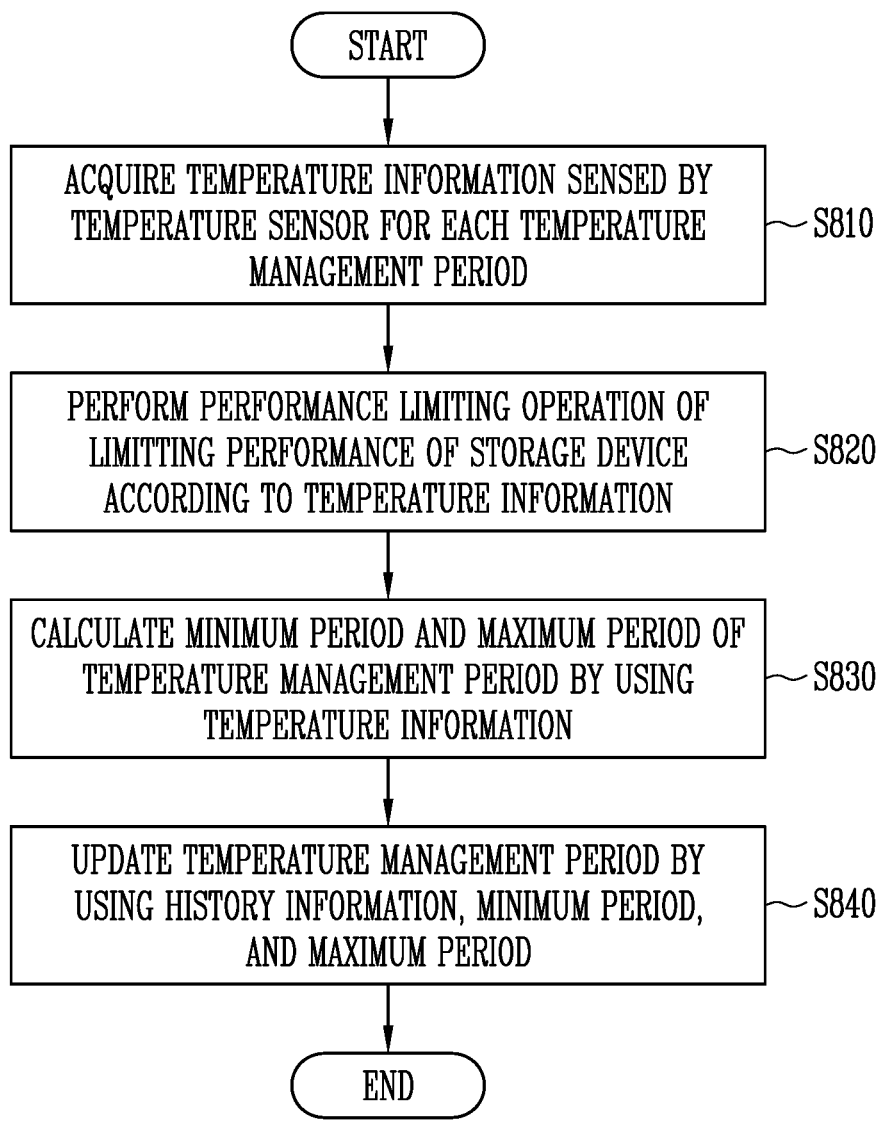
FIG. 8 is a flowchart illustrating an operating method of the storage device in accordance with an embodiment of the present disclosure.

FIG. 8 is a flowchart illustrating an operating method of the storage device in accordance with an embodiment of the present disclosure.

Referring to FIG. 8, an operating method of the storage device including the temperature sensor is illustrated. The storage device 1000 may acquire temperature information sensed by the temperature sensor for each temperature management period (S810). The temperature information may be a code CODE corresponding to a temperature sensed by the temperature sensor 140. The storage device 1000 may map the code CODE and the temperature according to a resolution, and the code CODE may be implemented with a higher resolution as the number of bits becomes larger.

Also, the storage device 1000 may perform a performance limiting operation of limiting the performance of the storage device 1000 according to the temperature information (S820). The performance limiting operation may be an operation of limiting an internal operation of the storage device such that an internal temperature of the storage device 1000 is decreased. The storage device 1000 may control a total current amount flowing into the storage device 1000 by suspending the whole or a portion of an operation performed in the storage device 1000. The storage device 1000 controls the total current amount, to prevent a case where the internal temperature of the storage device 1000 is excessively overheated. Alternatively, the storage device 1000 may decrease a processing speed (e.g., a clock number per a unit of time) of the internal operation, to prevent a case where the internal temperature of the storage device 1000 is excessively overheated.

Also, the storage device 1000 may calculate a minimum period and a maximum period of the temperature management period by using the temperature information and the reference temperature management period (S830). Specifically, the storage device 1000 may calculate the minimum period and the maximum period by using a temperature variation per a unit of time and the reference temperature management period. The storage device 1000 may determine the minimum period and the maximum period to increase the minimum period and the maximum period when the temperature variation per a unit of time increases and to decrease the minimum period and the maximum period when the temperature variation per a unit of time decreases.

In accordance with an embodiment of the present disclosure, the storage device 1000 may determine a current temperature reflected period according to whether a temperature of the memory device 100 corresponding to the temperature information belongs to one of a first range, a second range, and a third range. The first range may be a temperature range higher than a first temperature and lower than or equal to a second temperature. The second range may be one or more of a temperature range higher than 0° C. and lower than or equal to the first temperature and a temperature range higher than the second temperature and lower than or equal to a third temperature. The third range may be one or more of a temperature range lower than or equal to 0° C. and a temperature range higher than the third temperature.

When the temperature of the memory device 100 corresponding to the temperature information belongs to the first range, the storage device 1000 may determine the maximum period as the current temperature reflected period. When the temperature of the memory device 100 corresponding to the temperature information belongs to the second range, the storage device 1000 may determine an arithmetic mean value of the minimum period and the maximum period as the current temperature reflected period. When the temperature of the memory device 100 corresponding to the temperature information belongs to the third range, the storage device 1000 may determine the minimum period as the current temperature reflected period.

In accordance with an embodiment of the present disclosure, the storage device 1000 may store the temperature information and a number of times the performance limiting operation is performed from after power is applied to the storage device 1000. Also, the storage device 1000 may update the temperature management period by using history information on the performance limiting operation being performed, the minimum period, and the maximum period (S840). In accordance with an embodiment of the present disclosure, the storage device 1000 may determine a current temperature reflected period determined by one of the minimum period, the maximum period, and the arithmetic mean value of the minimum period and the maximum period, and determine a history reflected period according to the number of times the performance limiting operation is performed from after the power is applied to the storage device 1000. Also, the storage device 1000 may update the temperature management period by using the current temperature reflected period and the history reflected period.

Figure 9:
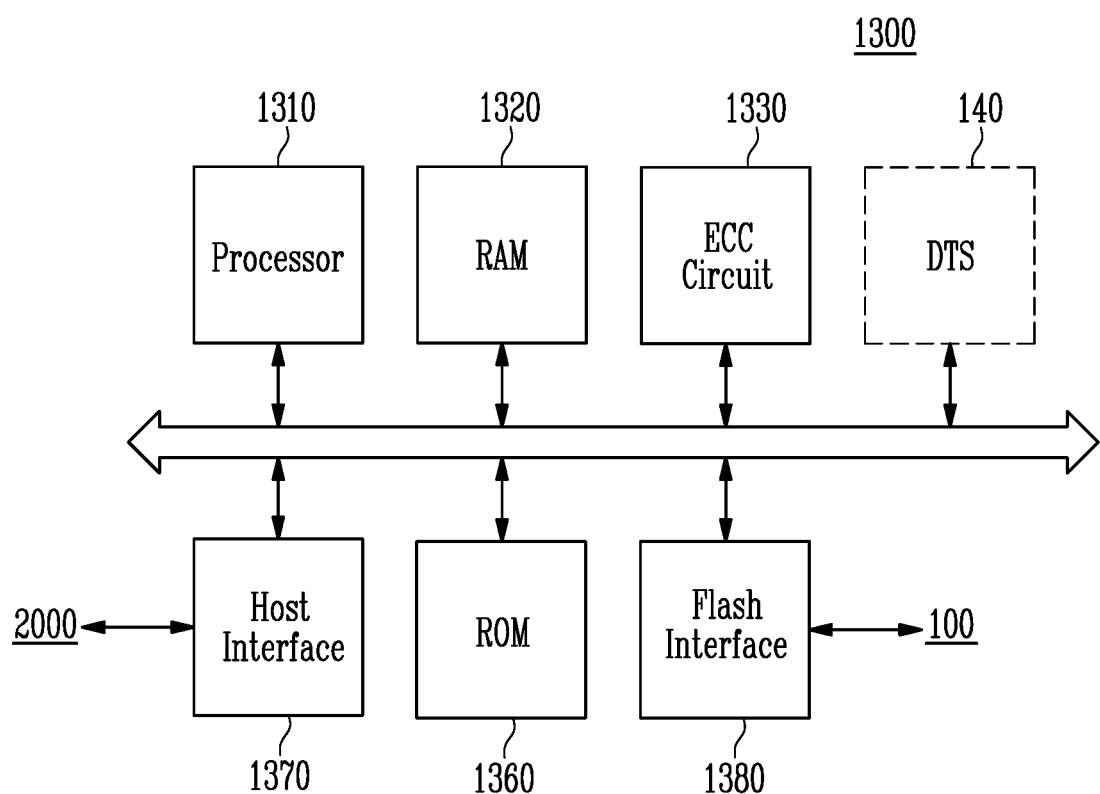
FIG. 9 is a block diagram illustrating a memory controller in accordance with another embodiment of the present disclosure.

FIG. 9 is a block diagram illustrating a memory controller in accordance with another embodiment of the present disclosure.

Referring to FIG. 9, the memory controller 1300 may include a processor 1310, a RAM 1320, and an ECC circuit 1330, a ROM 1360, a host interface 1370, a flash interface 1380, and a temperature sensor 140. The memory controller 1300 shown in FIG. 9 may be another embodiment of the memory controller 200 shown in FIG. 1 or 6.

The processor 1310 may communicate with the host 2000 by using the host interface 1370, and perform a logical operation to control an operation of the memory controller 1300. For example, the processor 1310 may load a program command, a data file, a data structure, etc., based on a request received from the host 2000 or an external device, and perform various operations or generate a command and an address. For example, the processor 1310 may generate various commands necessary for a program operation, a read operation, an erase operation, a suspend operation, and a parameter setting operation.

Also, the processor 1310 may perform a function of a Flash Translation Layer (FTL). The processor 250 may translate a Logical Block Address (LBA) provided by the host 2000 into a Physical Block Address (PBA) through the FTL. The FTL may receive an LBA input to translate the LBA into a PBA by using a mapping table. Several address mapping methods of the FTL exist according to mapping units. A representative address mapping method includes a page mapping method, a block mapping method, and a hybrid mapping method.

Also, the processor 1310 may generate a command without any request from the host 2000. For example, the processor 1310 may generate a command for background operations such as operations for wear leveling of the memory device 100 and operations for garbage collection of the memory device 100.

The RAM 1320 may be used as a buffer memory, a working memory, or a cache memory of the processor 1310. Also, the RAM 1320 may store codes and commands, which the processor 1310 executes. The RAM 1320 may store data processed by the processor 1310. Also, the RAM 1320 may be implemented as a Static RAM (SRAM) or a Dynamic RAM (DRAM).

The ECC circuit 1330 may detect an error in a program operation or a read operation, and correct the detected error. Specifically, the ECC circuit 1330 may perform an error correction operation according to an Error Correction Code (ECC). Also, the ECC circuit 1330 may perform ECC encoding, based on data to be written to the memory device 100. The data on which the ECC encoding is performed may be transferred to the memory device 100 through the flash interface 1380. Also, the ECC circuit 1330 may perform ECC decoding on data received from the memory device 100 through the flash interface 1380.

The ROM 1360 may be used as a storage unit for storing various information necessary for an operation of the memory controller 1300. Specifically, the ROM 1360 may include a map table, and physical-to-logical address information and logical-to-physical address information may be stored in the map table. Also, the ROM 1360 may be controlled by the processor 1310.

The host interface 1370 may include a protocol for exchanging data between the host 2000 and the memory controller 1300. Specifically, the host interface 1370 may communicate with the host 2000 through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The flash interface 1380 may communicate with the memory device 100 by using a communication protocol under the control of the processor 1310. Specifically, the flash interface 1380 may communicate a command, an address, and data with the memory device 100 through a channel. For example, the flash interface 1380 may include a NAND interface.

In accordance with another embodiment of the present disclosure, the memory controller 1300 may include the temperature sensor 140. The temperature sensor 140 shown in FIG. 9 may include the same configuration as the temperature sensor 140 described in FIG. 2 or 3, and perform the same function as the temperature sensor 140 described in FIG. 2 or 3. Specifically, the temperature sensor 140 may be disposed at the inside of the memory controller 1300 to sense temperature information of the memory controller 1300 under the control of the processor 1310. Also, the temperature sensor 140 may be disposed at the inside of the memory device 100 in addition to the memory controller 1300, to acquire accurate temperature information of the storage device 1000. For example, the memory controller 1300 may acquire accurate temperature information by comparing temperature information received from the temperature sensor 140 disposed at the inside thereof with temperature information received from the temperature sensor 140 disposed in the memory device 100, etc.

Figure 10:
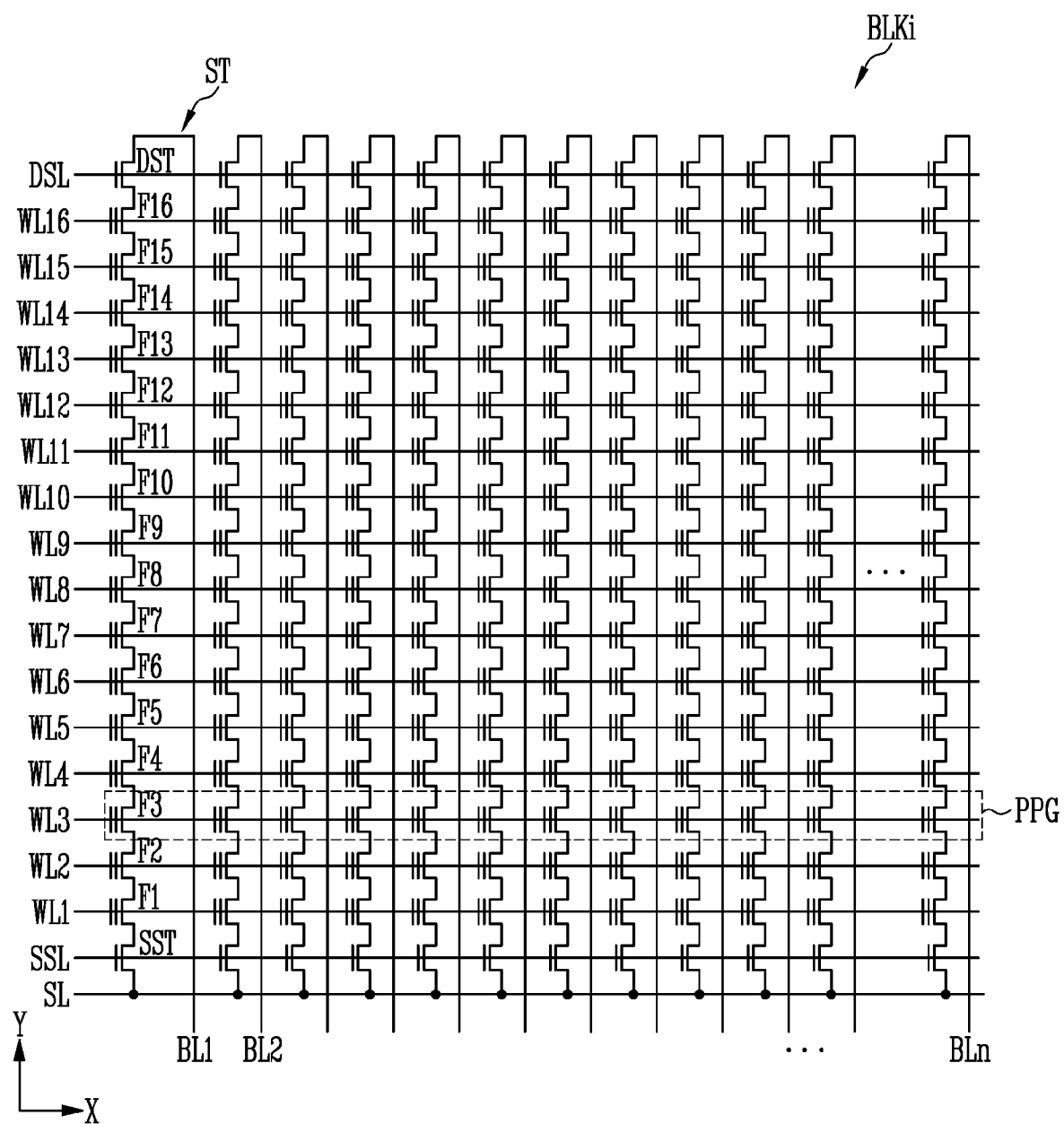
FIG. 10 is a diagram illustrating a memory block in accordance with an embodiment of the present disclosure.

FIG. 10 is a diagram illustrating a memory block in accordance with an embodiment of the present disclosure.

Referring to FIG. 10, one memory block BLKi among the memory blocks shown in FIG. 2 is illustrated. In the memory block BLKi, a plurality of word lines arranged in parallel to each other may be connected between a first select line and a second select line. The first select line may be a source select line SSL, and the second select line may be a drain select line DSL. More specifically, the memory block BLKi may include a plurality of strings ST connected between bit lines BL1 to BLn and a source line SL. The bit lines BL1 to BLn may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST, and a number of memory cells greater than that of the memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells F1 to F16 may be connected to a plurality of word lines WL1 to WL16. A group of memory cells connected to the same word line among memory cells included in different strings ST may be referred to as a physical page PPG. Therefore, physical pages PPG corresponding to the number of the word lines WL1 to WL16 may be included in the memory block BLKi.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The SLC may store one-bit data. One physical page PPG of the SLC may store one logical page (LPG) data. The one LPG data may include a number of data bits corresponding to the number of cells included in the one physical page PPG.

The MLC, the TLC, and the QLC may store two or more-bit data. One physical page PPG may store two or more LPG data.

Figure 11:
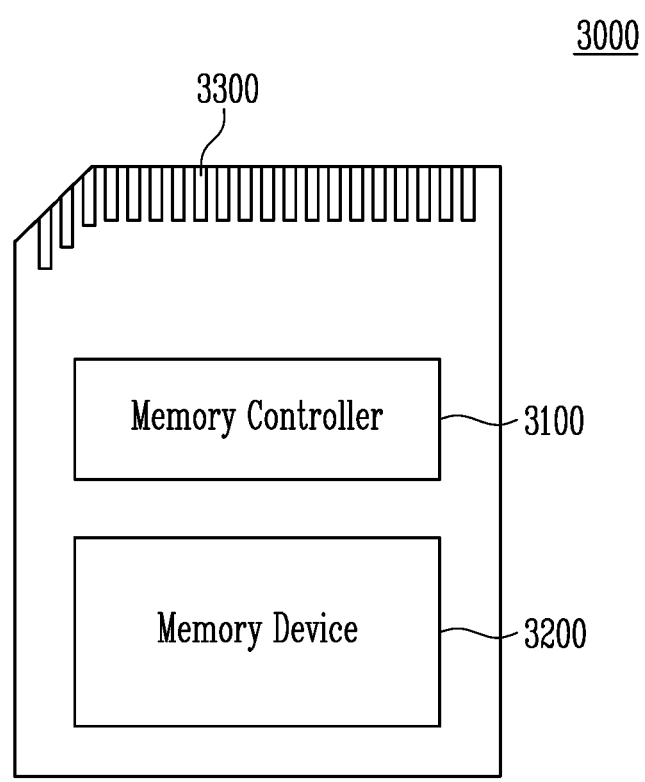
FIG. 11 is a diagram illustrating a memory card system in accordance with an embodiment of the present disclosure.

FIG. 11 is a diagram illustrating a memory card system in accordance with an embodiment of the present disclosure.

Referring to FIG. 11, the memory card system 3000 includes a memory controller 3100, a memory device 3200, and a connector 3300.

The memory controller 3100 may be connected to the memory device 3200. The memory controller 3100 may access the memory device 3200. For example, the memory controller 3100 may control read, write, erase, and background operations on the memory device 3200. The memory controller 3100 may provide an interface between the memory device 3200 and a host. Also, the memory controller 3100 may drive firmware for controlling the memory device 3200.

For example, the memory controller 3100 may include components such as a Random Access Memory (RAM), a processing unit, a host interface, a memory interface, and the error corrector 233.

The memory controller 3100 may communicate with an external device through the connector 3300. The memory controller 3100 may communicate with the external device (e.g., the host) according to a specific communication protocol. The memory controller 3100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

The memory device 3200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 3100 and the memory device 3200 may be integrated into a single semiconductor device, to constitute a memory card. For example, the memory controller 3100 and the memory device 3200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 12:
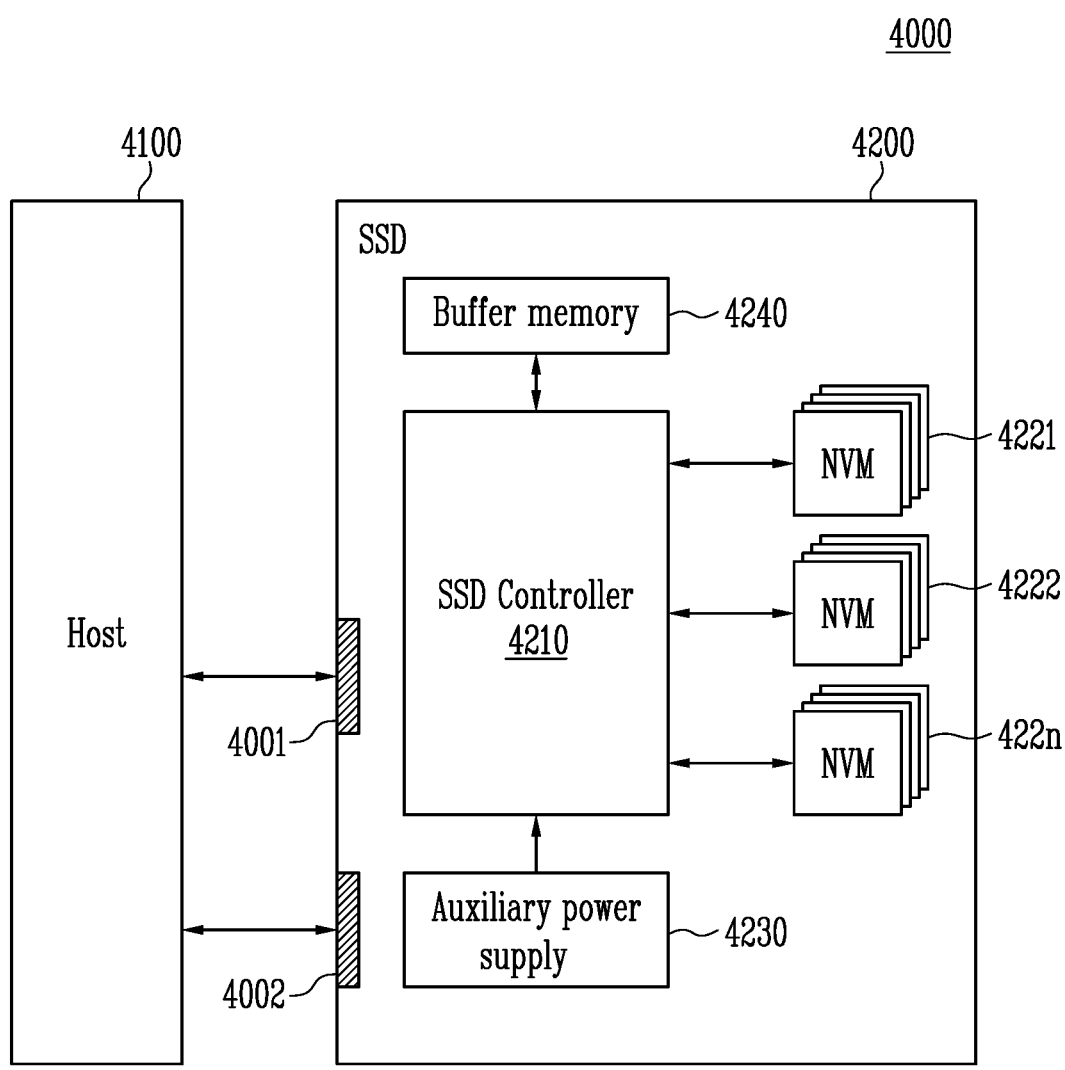
FIG. 12 is a diagram illustrating a Solid State Drive (SSD) in accordance with an embodiment of the present disclosure.

FIG. 12 is a diagram illustrating a Solid State Drive (SSD) in accordance with an embodiment of the present disclosure.

Referring to FIG. 12, the SSD system 4000 includes a host 4100 and an SSD 4200. The SSD 4200 exchanges a signal SIG with the host 4100 through a signal connector 4001, and receives power PWR through a power connector 4002. The SSD 4200 includes an SSD controller 4210, a plurality of flash memories 4221 to 422n, an auxiliary power supply 4230, and a buffer memory 4240.

In an embodiment, the SSD controller 4210 may serve as the memory controller 200 described with reference to FIG. 1 or 6. The SSD controller 4210 may control the plurality of flash memories 4221 to 422n in response to a signal SIG received from the host 4100. The signal SIG may be a signal based on an interface between the host 4100 and the SSD 4200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power to the SSD 4200. The auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of flash memories 4221 to 422n, or temporarily store meta data (e.g., a mapping table) of the flash memories 4221 to 422n. The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 13:
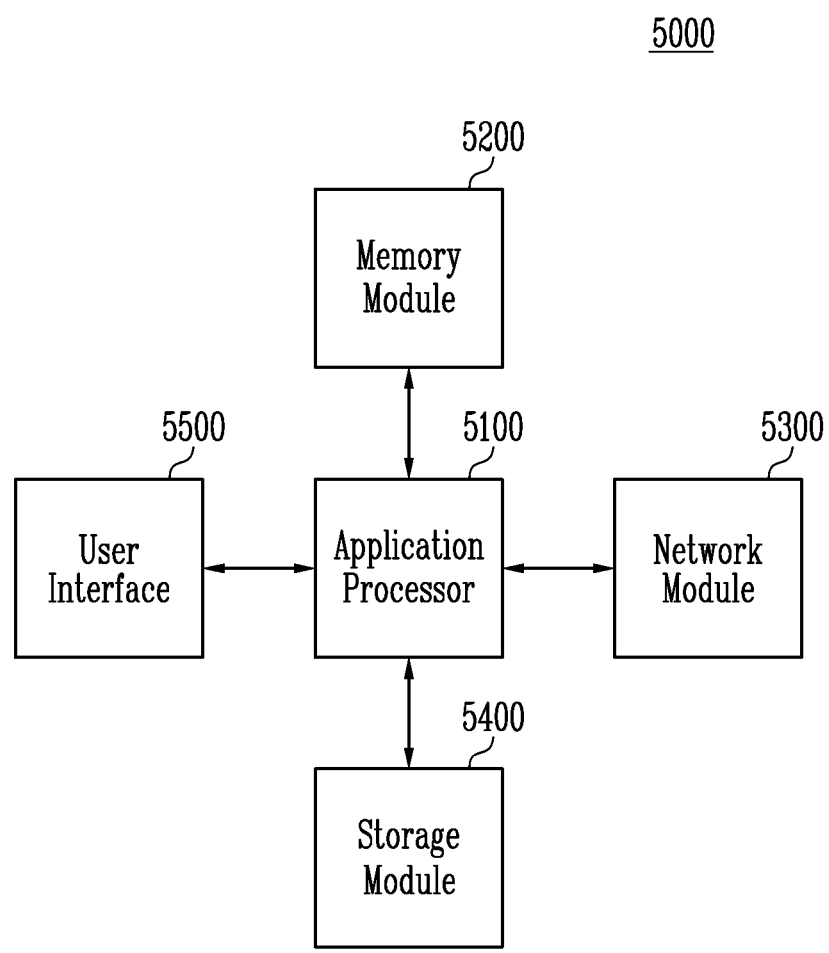
FIG. 13 is a diagram illustrating a user system in accordance with an embodiment of the present disclosure.

FIG. 13 is a diagram illustrating a user system in accordance with an embodiment of the present disclosure.

Referring to FIG. 13, the user system 5000 includes an application processor 5100, a memory module 5200, a network module 5300, a storage module 5400, and a user interface 5500.

The application processor 5100 may drive components included in the user system 5000, an operating system (OS), a user program, or the like. The application processor 5100 may include controllers for controlling components included in the user system 5000, interfaces, a graphic engine, and the like. The application processor 5100 may be provided as a System-on-Chip (SoC).

The memory module 5200 may operate as a main memory, working memory, buffer memory or cache memory of the user system 5000. The memory module 5200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 5100 and the memory module 5200 may be provided as one semiconductor package by being packaged based on a Package on Package (PoP).

The network module 5300 may communicate with external devices. The network module 5300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 5300 may be included in the application processor 5100.

The storage module 5400 may store data. For example, the storage module 5400 may store data received from the application processor 5100. Alternatively, the storage module 5400 may transmit data stored therein to the application processor 5100. The storage module 5400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. The storage module 5400 may be provided as a removable drive such as a memory card of the user system 5000 or an external drive.

The storage module 5400 may include a plurality of nonvolatile memory devices, and the plurality of nonvolatile memory devices may operate identically to the memory device described with reference to FIG. 1 or 2. The storage module 4400 may operate identically to the storage device 1000 described with reference to FIG. 1.

The user interface 5500 may include interfaces for inputting data or commands to the application processor 5100 or outputting data to an external device. The user interface 5500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 5500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a storage device for performing an improved temperature management operation and an operating method of the storage device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Various embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

The above-described embodiments of the present invention are intended to illustrate and not to limit the present invention. Various alternatives and equivalents are possible. The invention is not limited by the embodiments described herein. Nor is the invention limited to any specific type of storage device. Additions, subtractions, or modifications which are apparent in view of the present disclosure are intended to fall within the scope of the appended claims.

What is claimed is:

1. A storage device comprising:
   a memory device including a temperature sensor; and
   a memory controller configured to:
   perform a temperature acquisition operation to acquire temperature information sensed by the temperature sensor during a temperature management period,
   calculate a minimum period and a maximum period based on the temperature information and a reference temperature management period, and
   update the temperature management period, using at least one selected from among the minimum period and the maximum period according to history information on a count of a performance limiting operation to limit an operating performance of the memory device, and
   perform the temperature acquisition operation according to the updated temperature management period.

2. The storage device of claim 1, wherein the memory controller includes:
   a period calculator configured to calculate the minimum period and the maximum period by using a temperature variation per a unit of time within each temperature management period and the reference temperature management period;
   a period determiner configured to:
   determine, as a current temperature reflected period, one of the minimum period, the maximum period, and an arithmetic mean value of the minimum period and the maximum period according to the temperature information, and
   determine a history reflected period according to the count of the performance limiting operation after power is applied to the storage device; and
   a period updater configured to update the temperature management period by using the current temperature reflected period, the history reflected period, the minimum period and the maximum period.

3. The storage device of claim 2, wherein the period calculator increases the minimum period and the maximum period when the temperature variation increases.

4. The storage device of claim 2, wherein the period calculator decreases the minimum period and the maximum period when the temperature variation decreases.

5. The storage device of claim 2,
   wherein the period determiner determines the current temperature reflected period according to whether a temperature of the memory device corresponding to the temperature information belongs to one of a first range, a second range, and a third range,
   wherein the first range is a temperature range higher than a first temperature and lower than or equal to a second temperature,
   wherein the second range is one or more of a temperature range higher than 0° C. and lower than or equal to the first temperature and a temperature range higher than the second temperature and lower than or equal to a third temperature, and
   wherein the third range is one or more of a temperature range lower than or equal to 0° C. and a temperature range higher than the third temperature.

6. The storage device of claim 5, wherein, when the temperature of the memory device corresponding to the temperature information belongs to the first range, the period determiner determines the maximum period as the current temperature reflected period.

7. The storage device of claim 5, wherein, when the temperature of the memory device corresponding to the temperature information belongs to the second range, the period determiner determines the arithmetic mean value of the minimum period and the maximum period as the current temperature reflected period.

8. The storage device of claim 5, wherein, when the temperature of the memory device corresponding to the temperature information belongs to the third range, the period determiner determines the minimum period as the current temperature reflected period.

9. The storage device of claim 2, wherein the memory controller further includes:
   a temperature information storage configured to store the temperature information; and
   a history information storage configured to store the count of the performance limiting operation after the power is applied to the storage device.

10. The storage device of claim 2, wherein the period updater updates the temperature management period by using an arithmetic mean value of the current temperature reflected period and the history reflected period.

11. The storage device of claim 1, wherein, when a temperature of the memory device corresponding to the temperature information is higher than a third temperature, the memory controller performs the performance limiting operation of limiting the operating performance of the memory device.

12. A method for operating a storage device including a temperature sensor, the method comprising:
    performing a temperature acquisition operation to acquire temperature information sensed by the temperature sensor during a temperature management period;
    calculating a minimum period and a maximum period based on the temperature information and a reference temperature management period;
    updating the temperature management period using at least one selected from among the minimum period and the maximum period according to history information on a count of a performance limiting operation; and
    performing the temperature acquisition operation according to the updated temperature management period.

13. The method of claim 12, further comprising:
    determining, as a current temperature reflected period, one of the minimum period, the maximum period, and the arithmetic mean value of the minimum period and the maximum period according to the temperature information; and
    determining a history reflected period according to the count of the performance limiting operation after power is applied to the storage device.

14. The method of claim 13, wherein the temperature management period is updated by using the current temperature reflected period and the history reflected period.

15. The method of claim 12, wherein the calculating includes:

increasing the minimum period and the maximum period when a temperature variation per a unit of time corresponding to the temperature information increases, and decreasing the minimum period and the maximum period when the temperature variation decreases.

16. The method of claim 13, wherein the current temperature reflected period is determined according to whether a temperature of the memory device corresponding to the temperature information belongs to one of a first range, a second range, and a third range, wherein the first range is a temperature range higher than a first temperature and lower than or equal to a second temperature, wherein the second range is one or more of a temperature range higher than 0° C. and lower than or equal to the first temperature and a temperature range higher than the second temperature and lower than or equal to a third temperature, and wherein the third range is one or more of a temperature range lower than or equal to 0° C. and a temperature range higher than the third temperature.

17. The method of claim 16, wherein the maximum period is determined as the current temperature reflected period when the temperature of the memory device corresponding to the temperature information belongs to the first range, wherein the arithmetic mean value of the minimum period and the maximum period is determined as the current temperature reflected period when the temperature of the memory device corresponding to the temperature information belongs to the second range, and wherein the minimum period is determined as the current temperature reflected period when the temperature of the memory device corresponding to the temperature information belongs to the third range.

18. The method of claim 12, further comprising storing the temperature information and the count of the performance limiting operation after power is applied to the storage device.

* * * * *